United States Patent
Gao (10) Patent No.: US 12,419,014 B2
(45) Date of Patent: Sep. 16, 2025

(54) MULTIPLE CHANNELS BASED COOLING DEVICE FOR CHIPS

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 107 days.

(21) Appl. No.: 17/326,850

(22) Filed: May 21, 2021

(65) Prior Publication Data

US 2022/0377942 A1 Nov. 24, 2022

(51) Int. Cl.
*H05K 7/20* (2006.01)
*H01L 23/427* (2006.01)

(52) U.S. Cl.
CPC ....... *H05K 7/20336* (2013.01); *H01L 23/427* (2013.01); *H05K 7/20309* (2013.01); *H05K 7/20318* (2013.01); *H05K 7/20327* (2013.01)

(58) Field of Classification Search
CPC .......... H05K 7/20336; H05K 7/20309; H05K 7/20318; H05K 7/20327; H01L 23/427
See application file for complete search history.

(56) References Cited

U.S. PATENT DOCUMENTS

| | | | | |
|---|---|---|---|---|
| 4,470,450 A | * | 9/1984 | Bizzell | F28D 15/043 165/104.33 |
| 9,500,413 B1 | * | 11/2016 | Rice | F28D 15/0233 |
| 10,959,352 B1 | * | 3/2021 | Chen | H05K 7/20772 |
| 11,044,835 B2 | * | 6/2021 | Chiu | H05K 7/20309 |
| 2009/0166008 A1 | * | 7/2009 | Lai | F28D 15/046 165/185 |
| 2012/0279686 A1 | * | 11/2012 | Chainer | H05K 7/20936 165/104.21 |
| 2016/0227672 A1 | * | 8/2016 | Lin | H05K 7/20254 |
| 2019/0203983 A1 | * | 7/2019 | Jeon | F25B 21/02 |
| 2020/0103947 A1 | * | 4/2020 | Rush | G06F 1/20 |
| 2022/0369513 A1 | * | 11/2022 | Franz | H05K 1/0201 |

FOREIGN PATENT DOCUMENTS

WO  WO-03062686 A2 * 7/2003 ......... F28D 15/0266

* cited by examiner

*Primary Examiner* — Gordon A Jones
(74) *Attorney, Agent, or Firm* — WOMBLE BOND DICKINSON (US) LLP (57) ABSTRACT

A multi-channel cold plate for cooling chip wherein a first set of cooling channels function as main cooling channels and a second set of cooling channels function as a secondary and/or backup cooling channels. The two sets of cooling channels are fluidly isolated from each other, such that cooling fluid from one sent of channels cannot flow or intermix with the cooling fluid of the other cooling channel. The secondary cooling channels can be operated when demand for heat removal is increased or when the main cooling channels is unable to manage the thermal condition of the chip properly.

20 Claims, 6 Drawing Sheets

MULTIPLE CHANNELS BASED COOLING DEVICE FOR CHIPS

FIELD OF THE INVENTION

Embodiments of the present invention relate generally to enhanced and reliable cooling of advanced microchips, such as microchips used in servers within data centers.

BACKGROUND

Cooling is a prominent factor in a computer system and data center design. The number of high performance electronic components, such as high performance processors packaged inside servers, has steadily increased, thereby increasing the amount of heat generated and dissipated during the ordinary operations of the servers. The proper operation of these processors is highly dependent on reliable removal of the heat they generate. Thus, proper cooling of the processors can provide high overall system reliability.

Electronics cooling is very important for computing hardware and other electronic devices, such as CPU servers, GPU servers, storage servers, networking equipment, edge and mobile system, on-vehicle computing box and so on. All these devices and computers are used for critical businesses and are the fundamentals of a company's daily business operations. The design of the hardware component and electronics packaging needs to improve to continuously support the performance requirements. Cooling of these electronic devices becomes more and more challenging to ensure that they function properly by constantly providing properly designed and reliable thermal environments.

Many advanced chips, and especially high power density chips, require liquid cooling. These chips are exceedingly expensive, so that every effort need to be taken to ensure proper heat removal from these chips. Moreover, the liquid cooling equipment must be highly reliable, since any irregularity in heat removal may lead to loss of the chips, causing loss of available processing time during the replacement operation, and even potential impact on the service level agreement which was handled by the lost chips.

While liquid cooling solution must provide the required thermal performance and reliability, since data centers may have thousands of chips requiring liquid cooling, the cost of the liquid cooling system must remain acceptable. The cost of liquid cooling systems may include the cost of introducing redundancy to enhance reliability. Additionally, since different chips have different cooling requirements, it would be desirable to provide a cooling design that is adaptable to these different requirements.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Disclosed embodiments provide an enhance cooling system for electronic devices, which may include single-chip module (SCM), system on a chip (SoC), multi-chip module (MCM), System in package (SIP), etc. For brevity, these are referred to herein as microchips or simply chips, but any such reference should be understood to include any of these and similar variances. As can be understood, such devices may have different cooling requirements, even within different areas of the encapsulated device itself. That is, different areas of the packaging may require different rate of heat removal.

A cooling solution is disclosed which provides increased reliability and heat removal capacity. The redundant design may be used either to increase the heat removal rate on demand, or to provide backup cooling when one cooling system fails. Disclosed embodiments also enable tailoring different heat removal rates at different areas of the packaging. The following disclosure starts by providing background information regarding example application of the disclosed embodiments, and then proceeds to disclose specific embodiments. While the example relates to operation within a data center, the disclosed embodiments are not limited to data centers.

Figure 1:
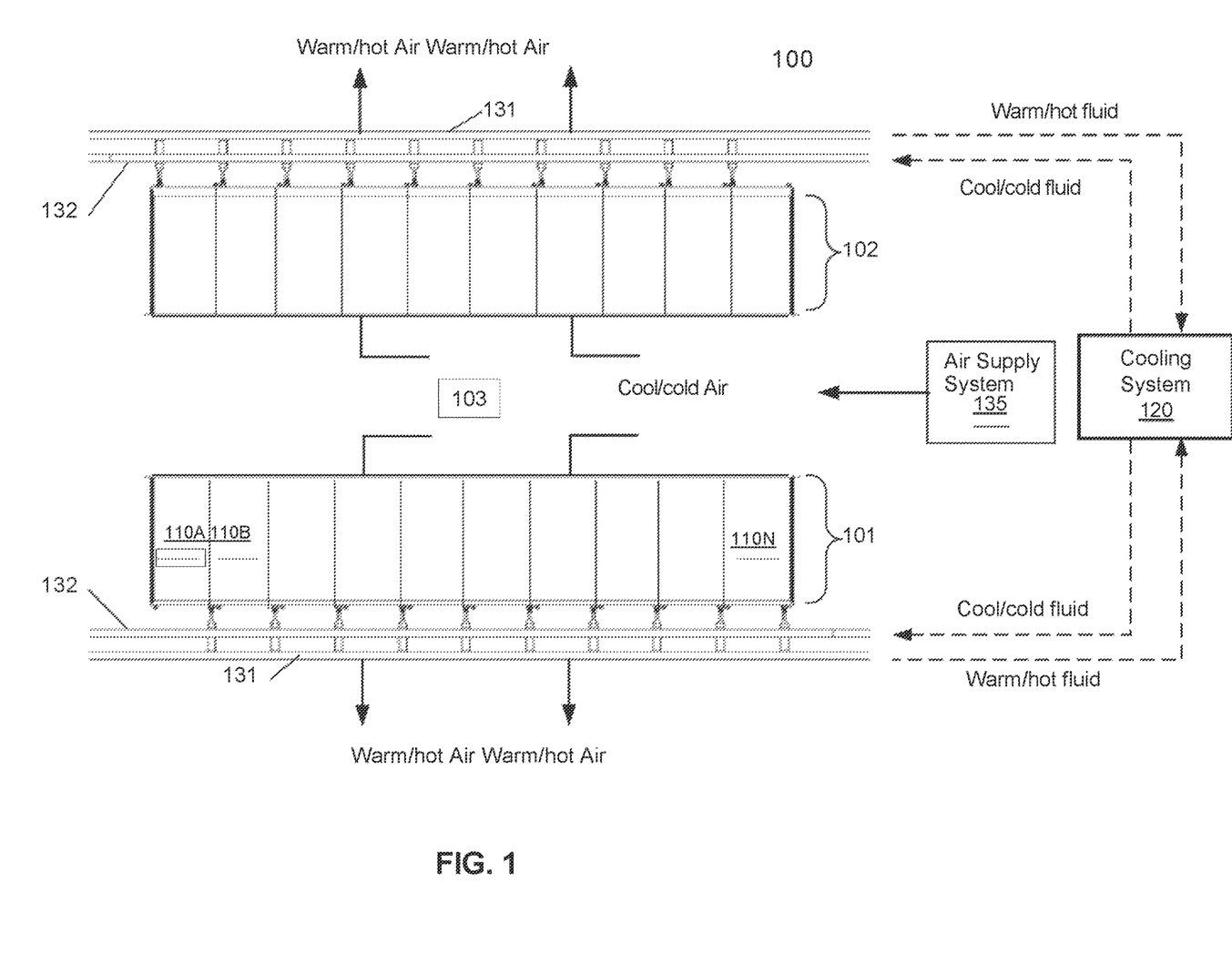
FIG. 1 is a block diagram illustrating an example of a data center facility according to one embodiment.

FIG. 1 is a block diagram illustrating an example of a data center or data center unit according to one embodiment. In this example, FIG. 1 shows a top view of at least a portion of a data center. Referring to FIG. 1, according to one embodiment, data center system 100 includes one or more rows of electronic racks of information technology (IT) components, equipment or instruments 101-102, such as, for example, computer servers or computing nodes that provide data services to a variety of clients over a network (e.g., the Internet). In this embodiment, each row includes an array of electronic racks such as electronic racks 110A-110N. However, more or fewer rows of electronic racks may be implemented. Typically, rows 101-102 are aligned in parallel with frontends facing towards each other and backends facing away from each other, forming aisle 103 in between to allow an administrative person walking therein. However, other configurations or arrangements may also be applied. For example, two rows of electronic racks may back to back face each other without forming an aisle in between, while their frontends face away from each other. The backends of the electronic racks may be coupled to the room cooling liquid manifolds.

In one embodiment, each of the electronic racks (e.g., electronic racks 110A-110N) includes a housing to house a number of IT components arranged in a stack operating therein. The electronic racks can include a cooling liquid manifold, a number of server slots (e.g., standard shelves or chassis configured with an identical or similar form factor), and a number of server chassis (also referred to as server blades or server shelves) capable of being inserted into and removed from the server slots. Each server chassis represents a computing node having one or more processors, a memory, and/or a persistent storage device (e.g., hard disk), where a computing node may include one or more servers operating therein. At least one of the processors is attached to a liquid cold plate (also referred to as a cold plate assembly) to receive cooling liquid. In addition, one or more optional cooling fans are associated with the server chassis to provide air cooling to the computing nodes contained therein. Note that the cooling system 120 may be coupled to multiple data center systems such as data center system 100.

In one embodiment, cooling system 120 includes an external liquid loop connected to a cooling tower or a dry cooler external to the building/housing container. The cooling system 120 can include, but is not limited to evaporative cooling, free air, rejection to large thermal mass, and waste heat recovery designs. Cooling system 120 may include or be coupled to a cooling liquid source that provide cooling liquid.

In one embodiment, each server chassis is coupled to the cooling liquid manifold modularly, such that a server chassis can be removed from the electronic rack without affecting the operations of remaining server chassis in the electronic rack and the cooling liquid manifold. In another embodiment, each server chassis is coupled to the cooling liquid manifold through a quick-release coupling assembly having a server liquid intake connector and a server liquid outlet connector coupled to a flexible hose to distribute the cooling liquid to the processors. The server liquid intake connector is to receive cooling liquid via a rack liquid intake connector from a cooling liquid manifold mounted on a backend of the electronic rack. The server liquid outlet connector is to emit warmer or hotter liquid carrying the heat exchanged from the processors to the cooling liquid manifold via a rack liquid outlet connector and then back to a coolant distribution unit (CDU) within the electronic rack.

In one embodiment, the cooling liquid manifold disposed on the backend of each electronic rack is coupled to liquid supply line 132 (also referred to as a room supply manifold) to receive cooling liquid from cooling system 120. The cooling liquid is distributed through a liquid distribution loop attached to a cold plate assembly on which a processor is mounted to remove heat from the processors. A cold plate is configured similar to a heat sink with a liquid distribution tube attached or embedded therein. The resulting warmer or hotter liquid carrying the heat exchanged from the processors is transmitted via liquid return line 131 (also referred to as a room return manifold) back to cooling system 120.

Liquid supply/return lines 131-132 are referred to as data center or room liquid supply/return lines (e.g., global liquid supply/return lines), which supply cooling liquid to all of the electronic racks of rows 101-102. The liquid supply line 132 and liquid return line 131 are coupled to a heat exchanger of a CDU located within each of the electronic racks, forming a primary loop. The secondary loop of the heat exchanger is coupled to each of the server chassis in the electronic rack to deliver the cooling liquid to the cold plates of the processors.

In one embodiment, data center system 100 further includes an optional airflow delivery system 135 to generate an airflow to cause the airflow to travel through the air space of the server chassis of the electronic racks to exchange heat generated by the computing nodes due to operations of the computing nodes (e.g., servers) and to exhaust the airflow exchanged heat to an external environment or a cooling system (e.g., air-to-liquid heat exchanger) to reduce the temperature of the airflow. For example, air supply system 135 generates an airflow of cool/cold air to circulate from aisle 103 through electronic racks 110A-110N to carry away exchanged heat.

The cool airflows enter the electronic racks through their frontends and the warm/hot airflows exit the electronic racks from their backends. The warm/hot air with exchanged heat is exhausted from room/building or cooled using a separate cooling system such as an air-to-liquid heat exchanger. Thus, the cooling system is a hybrid liquid-air cooling system, where a portion of the heat generated by a processor is removed by cooling liquid via the corresponding cold plate, while the remaining portion of the heat generated by the processor (or other electronics or processing devices) is removed by airflow cooling. Moreover, the liquid cooling may be multi-phase system wherein fluid flows in liquid or gaseous phase.

Figure 2:
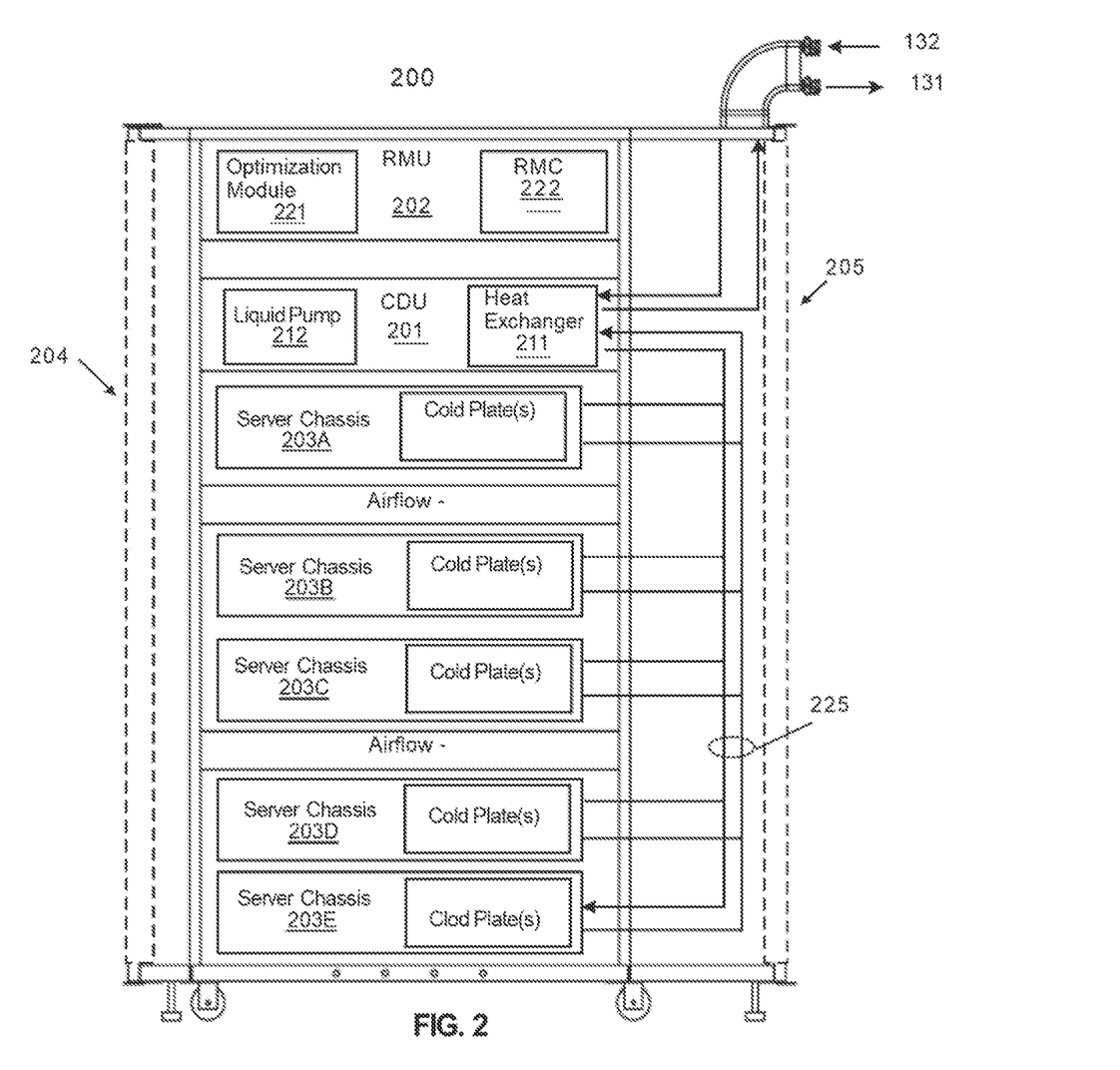
FIG. 2 is a block diagram illustrating an example of an electronic rack according to one embodiment.

FIG. 2 is block diagram illustrating an electronic rack according to one embodiment. Electronic rack 200 may represent any of the electronic racks as shown in FIG. 1, such as, for example, electronic racks 110A-110N. Referring to FIG. 2, according to one embodiment, electronic rack 200 includes, but is not limited to, CDU 201, rack management unit (RMU) 202, and one or more server chassis 203A-203E (collectively referred to as server chassis 203). Server chassis 203 can be inserted into an array of server slots (e.g., standard shelves) respectively from frontend 204 or backend 205 of electronic rack 200. Note that although there are five server chassis 203A-203E shown here, more or fewer server chassis may be maintained within electronic rack 200. Also note that the particular positions of CDU 201, RMU 202, and/or server chassis 203 are shown for the purpose of illustration only; other arrangements or configurations of CDU 201, RMU 202, and/or server chassis 203 may also be implemented. In one embodiment, electronic rack 200 can be either open to the environment or partially contained by a rack container, as long as the cooling fans can generate airflows from the frontend to the backend.

In addition, for at least some of the server chassis 203, an optional fan module (not shown) is associated with the server chassis. Each of the fan modules includes one or more cooling fans. The fan modules may be mounted on the backends of server chassis 203 or on the electronic rack to generate airflows flowing from frontend 204, traveling through the air space of the sever chassis 203, and existing at backend 205 of electronic rack 200.

In one embodiment, CDU 201 mainly includes heat exchanger 211, liquid pump 212, and a pump controller (not shown), and some other components such as a liquid reservoir, a power supply, monitoring sensors and so on. Heat exchanger 211 may be a liquid-to-liquid or multi-phase heat exchanger. Heat exchanger 211 includes a first loop with inlet and outlet ports having a first pair of liquid connectors coupled to external liquid supply/return lines 131-132 to form a primary loop. The connectors coupled to the external liquid supply/return lines 131-132 may be disposed or mounted on backend 205 of electronic rack 200. The liquid supply/return lines 131-132, also referred to as room liquid supply/return lines, may be coupled to cooling system 120 as described above. As will be shown below when disclosing specific embodiments of the cold plates, the arrangement of liquid supply/return lines 131-132 may be duplicated to provide two independent cooling loops. One loop may operate continuously while the second may operate when additional cooling capacity is needed or as a backup.

In addition, heat exchanger 211 further includes a second loop with two ports having a second pair of liquid connectors coupled to liquid manifold 225 (also referred to as a rack manifold) to form a secondary loop, which may include a supply manifold (also referred to as a rack liquid supply line or rack supply manifold) to supply cooling liquid to server chassis 203 and a return manifold (also referred to as a rack liquid return line or rack return manifold) to return warmer liquid back to CDU 201. Note that CDUs 201 can be any kind of CDUs commercially available or customized ones. Thus, the details of CDUs 201 will not be described herein.

Each of server chassis 203 may include one or more IT components (e.g., central processing units or CPUs, general/graphic processing units (GPUs), memory, and/or storage devices). Each IT component may perform data processing tasks, where the IT component may include software installed in a storage device, loaded into the memory, and executed by one or more processors to perform the data processing tasks. Server chassis 203 may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the computing nodes or compute servers (having one or more GPUs) managed by the host server. The compute servers perform the actual tasks, which may generate heat during the operations.

Electronic rack 200 further includes optional RMU 202 configured to provide and manage power supplied to servers 203, and CDU 201. RMU 202 may be coupled to a power supply unit (not shown) to manage the power consumption of the power supply unit. The power supply unit may include the necessary circuitry (e.g., an alternating current (AC) to direct current (DC) or DC to DC power converter, battery, transformer, or regulator, etc.,) to provide power to the rest of the components of electronic rack 200.

In one embodiment, RMU 202 includes optimization module 221 and rack management controller (RMC) 222. RMC 222 may include a monitor to monitor operating status of various components within electronic rack 200, such as, for example, computing nodes 203, CDU 201, and the fan modules. Specifically, the monitor receives operating data from various sensors representing the operating environments of electronic rack 200. For example, the monitor may receive operating data representing temperatures of the processors, cooling liquid, and airflows, which may be captured and collected via various temperature sensors. The monitor may also receive data representing the fan power and pump power generated by the fan modules and liquid pump 212, which may be proportional to their respective speeds. These operating data are referred to as real-time operating data. Note that the monitor may be implemented as a separate module within RMU 202.

Based on the operating data, optimization module 221 performs an optimization using a predetermined optimization function or optimization model to derive a set of optimal fan speeds for the fan modules and an optimal pump speed for liquid pump 212, such that the total power consumption of liquid pump 212 and the fan modules reaches minimum, while the operating data associated with liquid pump 212 and cooling fans of the fan modules are within their respective designed specifications. Once the optimal pump speed and optimal fan speeds have been determined, RMC 222 configures liquid pump 212 and cooling fans of the fan modules based on the optimal pump speeds and fan speeds.

As an example, based on the optimal pump speed, RMC 222 communicates with a pump controller of CDU 201 to control the speed of liquid pump 212, which in turn controls a liquid flow rate of cooling liquid supplied to the liquid manifold 225 to be distributed to at least some of server chassis 203. Similarly, based on the optimal fan speeds, RMC 222 communicates with each of the fan modules to control the speed of each cooling fan of the fan modules, which in turn control the airflow rates of the fan modules. Note that each of fan modules may be individually controlled with its specific optimal fan speed, and different fan modules and/or different cooling fans within the same fan module may have different optimal fan speeds.

Note that the rack configuration as shown in FIG. 2 is shown and described for the purpose of illustration only; other configurations or arrangements may also be applicable. For example, CDU 201 may be an optional unit. The cold plates of server chassis 203 may be coupled to a rack manifold, which may be directly coupled to room manifolds 131-132 without using a CDU. Although not shown, a power supply unit may be disposed within electronic rack 200. The power supply unit may be implemented as a standard chassis identical or similar to a sever chassis, where the power supply chassis can be inserted into any of the standard shelves, replacing any of server chassis 203. In addition, the power supply chassis may further include a battery backup unit (BBU) to provide battery power to server chassis 203 when the main power is unavailable. The BBU may include one or more battery packages and each battery package include one or more battery cells, as well as the necessary charging and discharging circuits for charging and discharging the battery cells.

Figure 3:
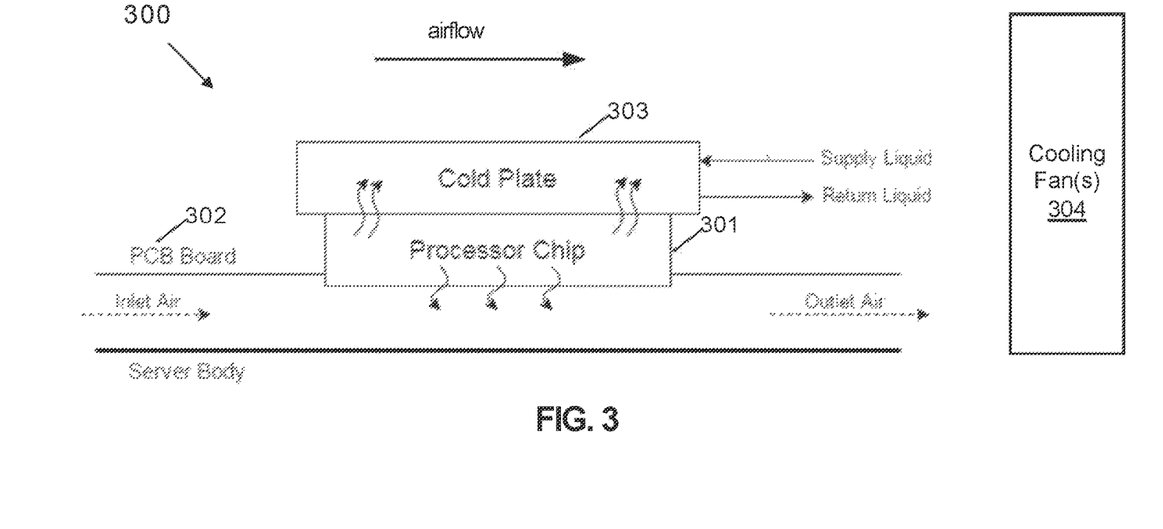
FIG. 3 is a block diagram illustrating an example of a cold plate configuration according to one embodiment.

FIG. 3 is a block diagram illustrating a chip cold plate configuration according to one embodiment. The chip/cold plate assembly 300 can represent any of the processors/cold plate structures of server chassis 203 as shown in FIG. 2. Referring to FIG. 3, chip 301 is plugged onto a socket mounted on printed circuit board (PCB) or motherboard 302 coupled to other electrical components or circuits of a data processing system or server. Chip 301 also includes a cold plate 303 attached to it, which is coupled to a rack manifold that is coupled to liquid supply line 132 and/or liquid return line 131 e.g., via blind mate connectors. A portion of the heat generated by chip 301 is removed by the cold plate 303. The remaining portion of the heat enters into an air space underneath or above, which may be removed by an airflow generated by cooling fan 304. Note that while a single arrow is illustrated for the supply liquid and a single arrow for the return liquid, some of the embodiments disclosed below may require two separate liquid supply lines and two separate liquid return lines.

Figure 4:
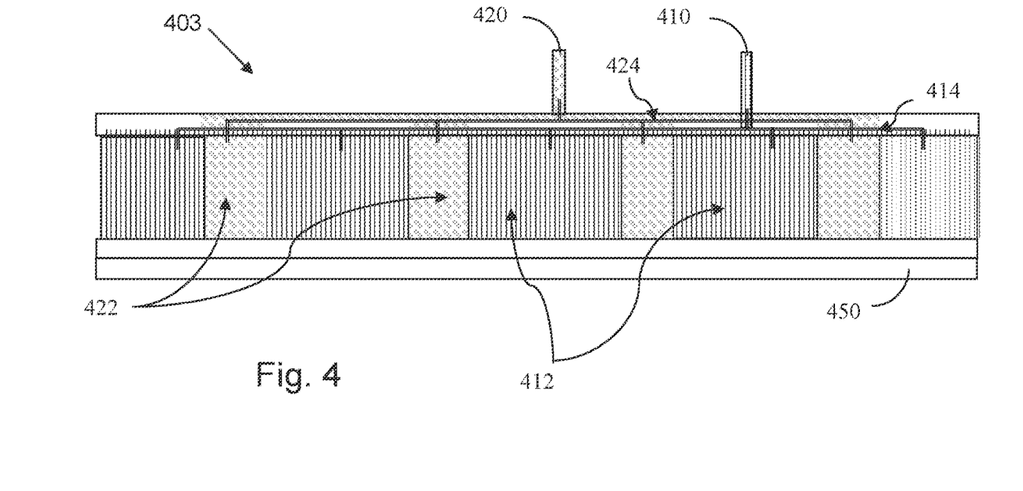
FIG. 4 is a conceptual schematic illustrating a cross-section of a cooling plate according to an embodiment.

FIG. 4 is a conceptual representation of a multi-channel cold plate 403 placed on top of chip 450, according to an embodiment, which is shown in cross-section. The body of the cold plate 403 may be made out of thermally conductive material, e.g., metal, such as copper or aluminum, or out of silicon. The cold plate 403 may be attached to the chip or pressed against the chip 450 by different packaging means, but the packaging means of attachment are not pertinent to the disclosed embodiments.

The multiple channels are fabricated in a single cold plate, wherein different channels function according to different thermal design. The channels may be distributed along the entire footprint of the of the cold plate, which may cover the entire area of the chip. In disclosed embodiments, the multiple channels may be customized for operating two different phase change coolants or two different modes of cooling, thus the main and secondary cooling channels are structured for operation according different thermal cycles. The two coolants may be independently distributed in two different cooling circulation system, for example one pumpless and one actively driven by a pump. The two cooling systems may be selected from various thermal cycles, such as pumped single or two phase cooling, pumpless single loop thermosyphon system, two phase evaporative dielectric coolant, etc., and the coolants may include water or other type of phase change coolant. In one embodiment, the design includes 3D vapor chamber as well as phase change channels (thermosiphon) coexisting in a single cooling device. The 3D vapor chamber may function differently to perform heat dissipation at different rate or different capacity from the recirculating cooling channels. In such an arrangement the 3D vapor chambers are self-contained autonomous cooling chambers, while the phase change channels are actively cooled by a cooling system which removes the vapor from the channels and deliver cooled liquid to the channels.

By having two different cooling channel circulations, the cooling plate can operate in different modes. For example, one cooling circulation can be operated as the main cooling and run continuously, while the second can serve as a backup, to be operated when the main cooling fails. In another example, the main cooling can be operated continuously, while the second is operated as a booster whenever the chip experiences high processing demand and therefore generates more heat. In yet another example, the size and number of channels of each coolant type can be distributed over the area of the plate according to the design of the chip, such that areas of enhanced processing get increased cooling rate, while areas of low heat dissipation get less cooling. In a further example, the cross-section and/or the footprint of the two channels is different, for example the channels of the main cooling circulation are larger than the channels of the backup or booster channels.

Returning to the example illustrated in FIG. 4, cold plate 403 has two inlet ports, 410 and 420. The plate also has two outlet ports, but they cannot be seen in this particular view. In this example main port 410 is the port of the main cooling system and provides cooling fluid to primary channels 412 via primary manifold 414. The primary channels 412 may include microfins to enhance heat transfer, and the main cooling system may be a pumpless two-phase cooling system (e.g., two-phase thermosiphon system). Secondary port 420 delivers cooling fluid to the secondary channels 422 via secondary manifold 424. The secondary channels 422 may be open channels without microfins, as illustrated, or may include fins similar to the primary channels 412, and the secondary cooling system may be a pumped two-phase cooling system. Also, as illustrated in FIG. 4, the secondary channels 422 are smaller, i.e., occupy less area, than the main channels 412. The main channels 412 can operate continuously as the main cooling system of the chip. The secondary channels 422 may operate as a booster or a backup cooling system that operates only when extra cooling is needed or when the main cooling system fails.

Thus, generally a cold plate is provided comprising a thermally conductive plate assembly incorporating a first set of cooling channels and a second set of cooling channels, and further having an intake port for delivering cooling fluid to the first set of cooling channels and a return port for removing vapor from the first set of cooling channels, and wherein the second set of cooling channels is fluidly isolated from the first set of cooling channels such that the cooling fluid from the first set of cooling channels is prevented from flowing into the second set of cooling channels. The second set of cooling channels may also be coupled to a cooling fluid inlet and a return outlet. Each of the cooling channels of the first set of cooling channels may include fins, while each of the cooling channels of the second set of cooling channels may or may not have fins. The cooling channels of the first set of cooling channels may be interlaced with the cooling channels of the second set of cooling channels.

Figure 5:
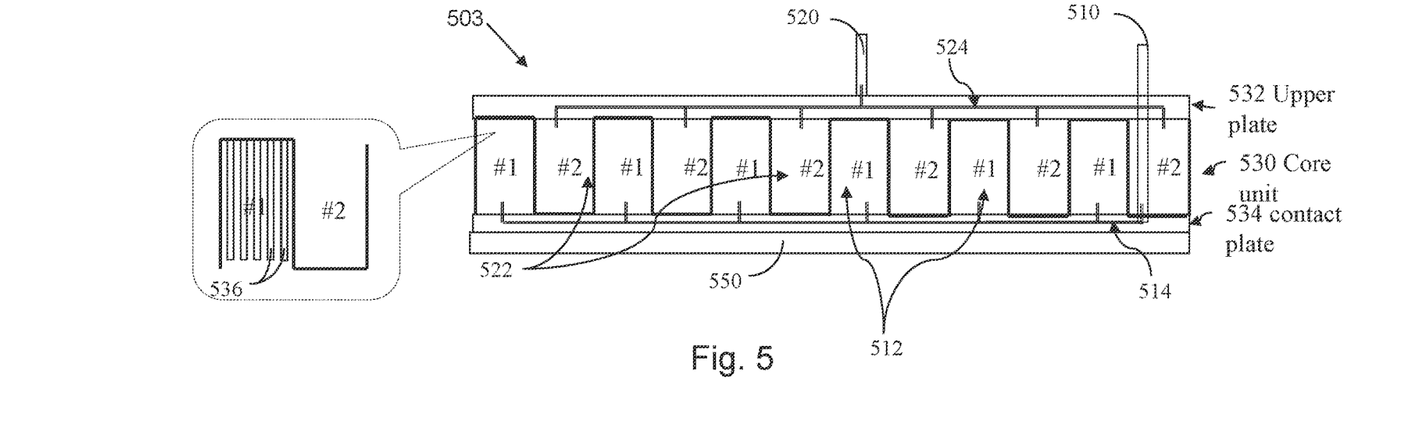
FIG. 5 is a general schematic of a cooling plate having a corrugated structure, according to an embodiment.

FIG. 5 illustrates an example of an embodiment that is structure in a corrugated format, akin to a corrugated cardboard. Cold plate 503 consists of a contact plate 534, which is in physical contact with the chip 550. A core unit 530 is sandwiched between the contact plate 534 and the upper plate 532. The core unit 530 is shaped into alternate ridges and grooves, thereby forming the corrugations. One side of the corrugation forms the channels for the main cooling system, e.g., channels 512, while the other side forms the channels for the secondary cooling system, e.g., channels 522. Consequently, the main and secondary channels are interlaced. In the example illustrated the corrugations are even, such that the channels are all of the same size. In another example, the corrugations may be skewed, such that the channels on the main cooling are of different size of the channels of the secondary cooling.

In the example illustrated in FIG. 5, the corrugations that open towards the contact plate 534 are indicated by #1 and circulate the main cooling fluid via manifold 514, which leads to inlet 410. The outlet cannot be seen in this view. Conversely, the corrugations that open towards the upper plate 532 are indicated by #2 and circulate the secondary cooling fluid via manifold 524, which leads to inlet 420. The secondary outlet cannot be seen in this view. As shown in the callout of FIG. 5, in one example, fins 536 are added inside the corrugations marked #1, while no fins are added to the corrugations marked #2. Conversely, in other embodiments fins 536 may be included in the corrugations marked #2 as well.

By the disclosed embodiments, a thermally conductive plate assembly is provided, comprising a contact plate; an upper plate; a core section sandwiched between the contact plate and the upper plate, wherein a first set of cooling channels and a second set of cooling channels are formed within the core section; and a main cooling fluid supply manifold is formed in one of the contact plate or the upper plate, and wherein the second set of cooling channels is fluidly isolated from the first set of cooling channels such that the cooling fluid from the first set of cooling channels is prevented from flowing into the second set of cooling channels. The core section may comprise alternate ridges and grooves forming corrugations. Also, the corrugations may be skewed, such that cooling channels of the first set of cooling channels are of different size than the cooling channels of the second set of cooling channels.

Figure 6:
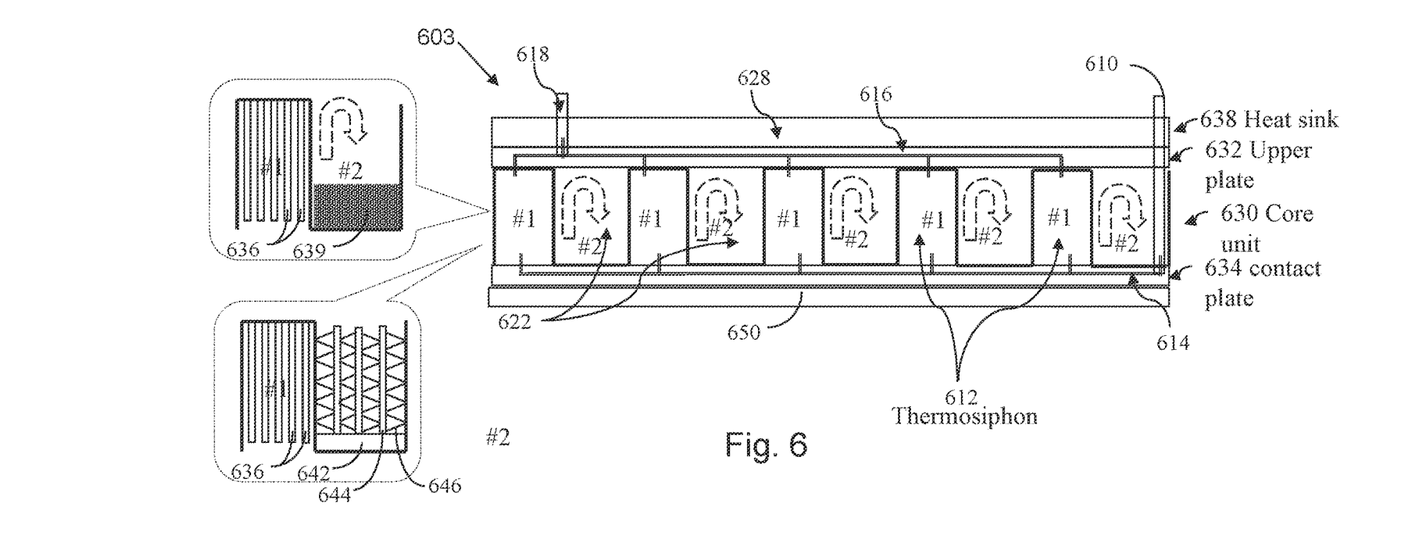
FIG. 6 illustrates a cooling plate wherein the secondary cooling channels are self-contained evaporation chambers, according to an embodiment.

FIG. 6 is a cross section of another embodiment incorporating multi-channel cooling plate of two different cooling methods. This particular example is shown utilizing the corrugated structure, but the features can be incorporated in any of the structures disclosed herein or other suitable structures. In this embodiment, the main cooling channels, identified by #1, are pure evaporation channels designed for thermosiphon, while the secondary cooling channels, identified as #2, are designed for two-phase cooling, wherein both evaporation and condensation occur internally within each channel.

In cold plate 603 the contact plate 634 may incorporate the inlet manifold 614, which delivers cooling fluid to main channels 612 from inlet port 610. Contact plate 634 physically contacts the chip 650 to remove heat therefrom. Cooling channels 612 operate as evaporation channels and the vapor is collected by outlet manifold 616, which may be incorporated in upper plate 632, to outlet port 618. As shown in the callouts, the main channels may incorporate cooling fins 636.

The core unit 630 is formed as a corrugated structure, wherein one side forms the main cooling channels while the opposite side forms the secondary cooling channels. In this example, the corrugations are asymmetrical or skewed, such that the size of the main cooling channels is different from the size of the secondary channels. In this particular illustration, the secondary channels are shown larger than the main channels, but the channels may be of the same size of the main channels may be larger than the secondary channels. In the embodiment of FIG. 6, the secondary cooling channels are designed as full two-phase channels, such that evaporation and condensation occur within the channels themselves. Therefore, no fluid supply or return ports are provided for the secondary channels, which may be self-contained sealed chambers. As shown in the dashed callout, the bottom portion of each secondary channel may include a wicking block 639, which may sustain cooling liquid. As the cooling liquid heats up, it evaporates and rises towards the top of the channel, where it contacts the upper plate 632 and condenses. Upon condensing the liquid returns to the wicking block 639, as exemplified by the curved arrow. To enhance condensation a heat sink 638 contacts and cools the upper plate 632. Heat sink 638 may be an air or liquid cooled heat sink. Therefore, in this embodiment, the bottom of each secondary channel 622 is extracting heat from the chip, and the top of each of the channels need to be liquid or air cooled to enable condensation.

In an alternative embodiment, illustrated in the dash-dot callout, the secondary cooling channels are formed as 3D vapor chambers. Each of the channels is a self-contained autonomous cooling unit which includes an evaporation chamber 642 and evaporation-condensation pipes 644 attached to cooling lamellas 646. As the liquid in the evaporation chamber 642 heats up, it vaporizes and rises in the pipes 644. The pipes are cooled by the lamellas 646, thereby also functioning as condensers with the lamellas functioning as fins. The condensing liquid returns to the evaporation chamber 642. Therefore, in this embodiment cooling liquid is supplied and returned only from the primary cooling channels 612, while no supply and return lines are provided to the secondary cooling channels 622 as they are self-contained.

By this disclosure, a cold plate is provided comprising a thermally conductive plate assembly incorporating a first set of cooling channels and a second set of cooling channels, and further having an intake port for delivering cooling fluid to the first set of cooling channels and a return port for removing vapor from the first set of cooling channels, and wherein the second set of cooling channels is fluidly isolated from the first set of cooling channels such that the cooling fluid from the first set of cooling channels is prevented from flowing into the second set of cooling channels, wherein the second set of cooling channels comprises a plurality of isolated self-contained sealed chambers, each forming a two-phase evaporation and condensation chamber. Each of the isolated self-contained sealed chambers may include a wicking block.

As can be appreciated, the heat removal rate and capacity of the main and secondary channels may be different. Consequently, the heat removal of the cold plate is non-uniform over the cooling plate's surface. There are applications where such non-uniform heat removal is acceptable or may be even desirable. However, there are applications where a uniform heat removal is desirable. An embodiment which enhances the uniformity of heat removal is illustrated in FIG. 7.

Figure 7:
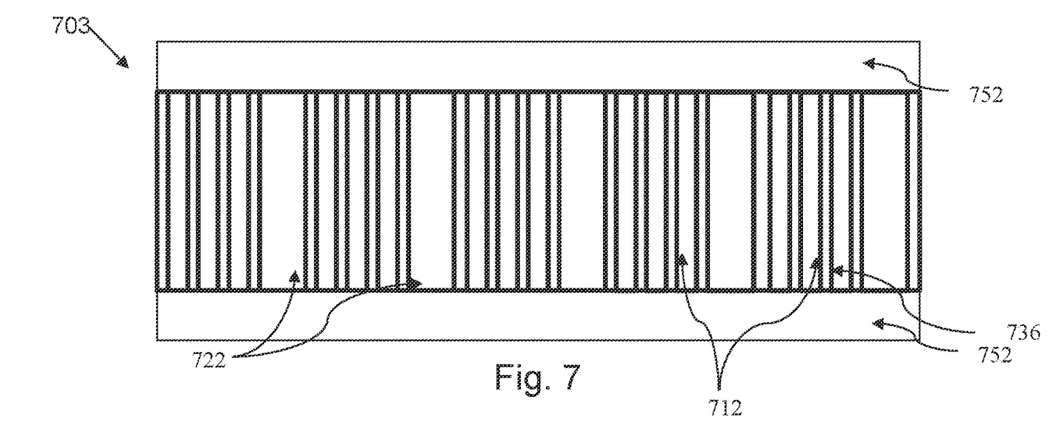
FIG. 7 is a top view of a cooling plate having heat spreaders, according to an embodiment.

FIG. 7 is a top view of a cooling plate 703. Cooling plate 703 may be of any of the embodiment illustrated herein, and has main channels 712 (which may include fins 736) and secondary channels 722. Additionally, each side of the cold plate 703 incorporates a heat spreader 752, which may be, e.g., a thermally conductive plate such as copper plate. The heat spreaders 752 act to spread the heat among the two different cooling channels, thus evening out the heat over the surface of the cold plate 703. Additionally, when the secondary channels are not operating, heat from the areas under the secondary channels can be removed by the primary channels since the heat will be conducted by the heat spreaders 752. Conversely, if the cooling system of the primary channels fail and the secondary channels are operating in backup capacity, the heat from the areas under the non-functioning primary channels would be conducted by the heat spreaders 752 towards the secondary channels.

Accordingly, a cold plate is provided comprising a thermally conductive plate assembly incorporating a first set of cooling channels and a second set of cooling channels, and further having an intake port for delivering cooling fluid to the first set of cooling channels and a return port for removing vapor from the first set of cooling channels, and wherein the second set of cooling channels is fluidly isolated from the first set of cooling channels such that the cooling fluid from the first set of cooling channels is prevented from flowing into the second set of cooling channels, and wherein the cold plate assembly further comprises at least one heat spreader in physical contact with the first set of cooling channels and the second set of cooling channels.

Figure 8:
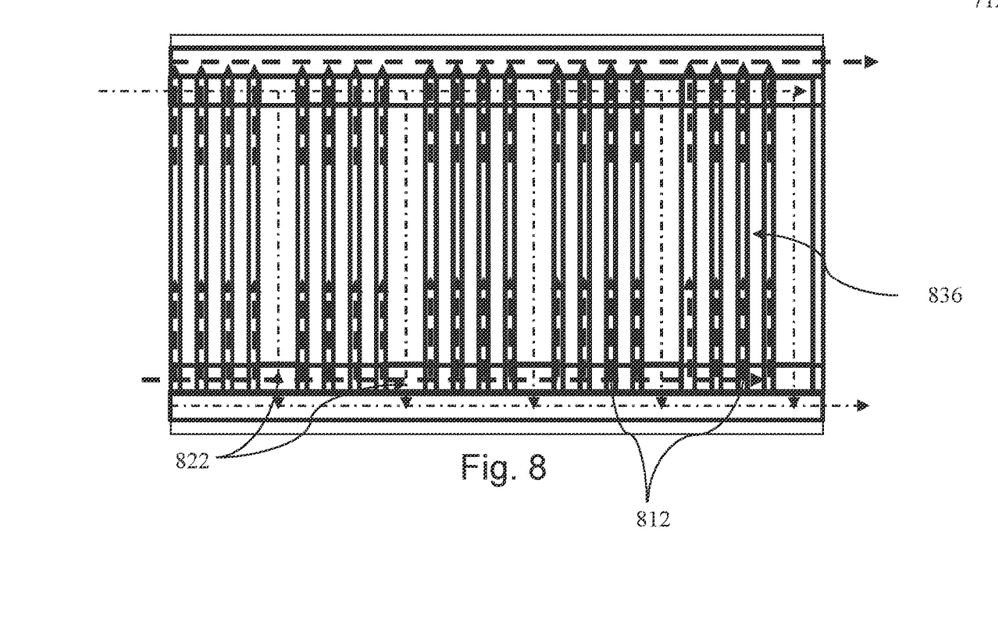
FIG. 8 illustrate, fluid flow and distribution in a cold plate according to disclosed embodiments.

FIG. 8 is a top view of a cold plate illustrating one method of creating cooling fluid flow in the main and secondary channels. In this illustration, the fluid flow in the secondary channels is in counter-direction to the flow in the main channels, but the flow may also be in the same direction. Also, in some embodiments the fluid manifolds may be incorporated into the heat spreaders. The fluid flow of the main cooling channels 812 is illustrated by the dashed arrow, while the fluid flow of the secondary cooling channels 822 is shown by the dash-dot arrows. Fins 836 enhance the heat collection of the cooling fluid in the main channels 812.

Figures 9, 10:
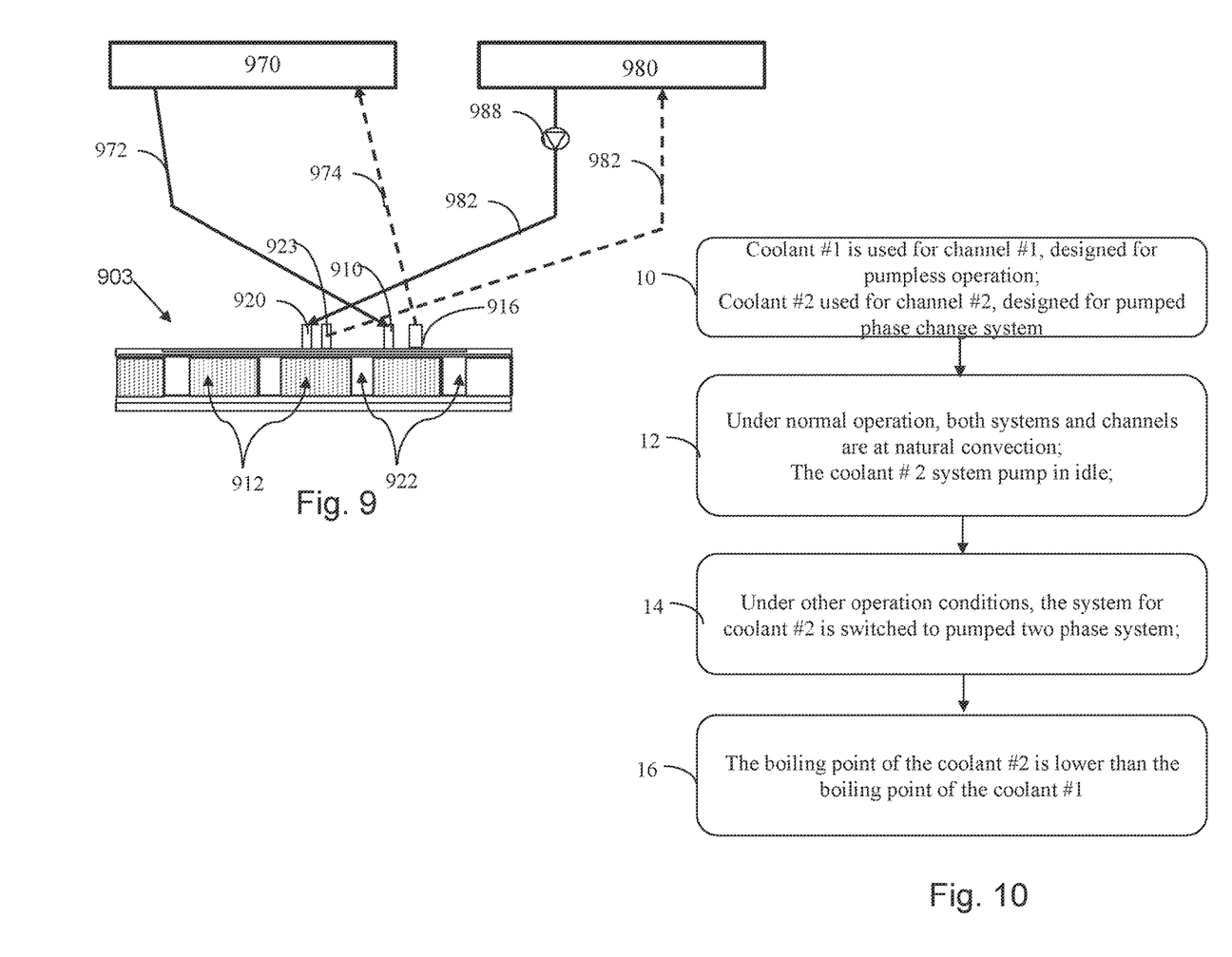
FIG. 9 illustrates a general overview of a cooling system employing a cold plate, according to an embodiment.
FIG. 10 is a general schematic illustrating the operation of a cooling system according to an embodiment.

FIG. 9 is a schematic illustrating an example of a cooling system utilizing the multi-channel cold plate 903 according to embodiments disclosed herein. While cold plate 903 may be constructed according to any of the embodiments disclosed herein, in the example of FIG. 9 cold plate 903 incorporates main cooling channels operating on thermosiphon two-phase pumpless thermal cycle, while the secondary cooling channels operated on a phase-change pumped thermal cycle. Of course, this is but only one example and other thermal cycles may be used.

In FIG. 9, cooling fluid is provided from condenser 970 to the inlet port 910 of the cold plate 903 via intake line 972. Cooling fluid flowing in intake line 972 may be any liquid coolant selected from standard coolants. The cooling fluid flowing in the primary cooling channels 912 convert to vapor, and the vapor is returned from outlet 916 to condenser 970 via return line 974. Similarly, cooling fluid is pumped by pump 988 from the secondary condenser 980 through intake lines 982 to inlet port 920 of the cold plate. The cooling fluid flows in secondary channels 922 and vaporizes. The vapor returns from outlet 923 to condenser 980 via return line 982. By activating the pump the secondary cooling system is energized, either as a backup cooling or to enhance heat removal on demand.

As can be seen, a cooling system for microchips is disclosed, comprising: a cold plate assembly incorporating a first set of cooling channels and a second set of cooling channels, wherein the second set of cooling channels is fluidly isolated from the first set of cooling channels such that the cooling fluid from the first set of cooling channels is prevented from flowing into the second set of cooling channels; a main condenser; a main supply line fluidly coupled between the main condenser and the first set of cooling channels; and a main return line fluidly coupled between the main condenser and the first set of cooling channels. The system may also include a secondary condenser; a secondary supply line fluidly coupled between the secondary condenser and the first set of cooling channels; a pump coupled to the secondary supply line; and a secondary return line fluidly coupled between the secondary condenser and the first set of cooling channels. Alternatively, the second set of cooling channels comprises a plurality of isolated self-contained sealed chambers, each forming a two-phase evaporation and condensation chamber.

FIG. 10 illustrates the operation of the multi-channel system, wherein two thermal cycles are employed by two separate cooling system which operate on the same cold plate. As indicated in 10, in this particular embodiment the main system utilizes a pumpless thermal cycle, e.g., thermosiphon circulation. The secondary system utilizes pumped phase change thermal cycle. As indicated by 12, during normal operation the pump is off, i.e., idles, and circulation in both systems may naturally occur by convection. When enhanced or backup cooling is needed, as indicated in 14, the pump is energized so as to mechanically force fluid flow into the secondary cooling channels. Per indication in 16, the boiling point of the coolant in the secondary system should be lower than the boiling point of the coolant in the main cooling system.

Thus, by the disclosed embodiments, a microchip cold plate is provided, having a first set of cooling fluid channels and a second set of fluid channels, the second set of fluid channels fluidly isolated from the first set of fluid channels, such that cooling fluid from the first set of cooling channels cannot enter the second set of fluid channels and cooling fluid flowing in the second set of cooling channels cannot enter into the first set of fluid channels. The cooling channels of the first set of cooling channels may interlace with the cooling channels of the second set of fluid channels.

According to further embodiments, an intake manifold distributes cooling fluid among the cooling channels of the first set and a return manifold collects vapor from the cooling channels of the first set and leads the vapor to a condenser. The cooling channels of the second set of cooling channels may be self-contained two-phase chambers, or may have cooling fluid intake and vapor outlet. When the second set of cooling channels include fluid inlet and vapor outlet it is desirable to include a pump to deliver the cooling fluid to the second set of cooling channels.

According to disclosed embodiments, a microchip cooling system is provided, comprising a main condenser; a cold plate includes a plurality of main cooling channels and a plurality of secondary cooling channels, the secondary cooling channels being fluidly isolated from the main cooling channels; a main intake conduit is coupled between the main condenser and an intake port of the main cooling channels and a return conduit is coupled between the main condenser and an outlet port of the main cooling channels.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A cooling plate for cooling microchips, comprising a thermally conductive plate assembly incorporating a first set of cooling channels and a second set of two-phase cooling channels, and further having an intake port for delivering cooling fluid to the first set of cooling channels and a return port for removing vapor from the first set of cooling channels, and wherein the second set of two-phase cooling channels is fluidly isolated from the first set of cooling channels such that the cooling fluid from the first set of cooling channels is prevented from flowing into the second set of two-phase cooling channels, wherein the first set of cooling channels and the second set of two-phase cooling channels form two different cooling channel circulations, wherein the first set of cooling channels circulation is operated as a main cooling and run continuously, and the second set of two-phase cooling channels circulation is operated as a backup, wherein the second set of two-phase cooling channels circulation is operated when the main cooling fails, wherein each of the second set of two-phase cooling channels comprises an evaporation chamber and evaporation condensation pipes attached to cooling lamellas, wherein the evaporation condensation pipes are inside the second set of two-phase cooling channels, wherein the cooling lamellas are inside the second set of two-phase cooling channels, wherein the cooling fluid in the evaporation chamber heats up, the cooling fluid vaporizes and rises in the evaporation condensation pipes, and the evaporation condensation pipes are cooled by the cooling lamellas, and wherein each of the second set of two-phase cooling channels comprises a wicking block to sustain the cooling fluid.

2. The cooling plate of claim 1, wherein the second set of two-phase cooling channels comprises a plurality of isolated self-contained sealed chambers, each forming a two-phase evaporation and condensation chamber.

3. The cooling plate of claim 2, wherein each of the isolated self-contained sealed chambers comprises the wicking block.

4. The cooling plate of claim 1, wherein the second set of two-phase cooling channels comprises a plurality of secondary cooling channels coupled to a cooling fluid inlet and a return outlet.

5. The cooling plate of claim 1, wherein each of the cooling channels of the first set of cooling channels comprises fins and each of the cooling channels of the second set of two-phase cooling channels does not have fins.

6. The cooling plate of claim 1, wherein the cooling channels of the first set of cooling channels are interlaced with the cooling channels of the second set of two-phase cooling channels.

7. The cooling plate of claim 6, wherein a cross-section of the cooling channels of the first set of cooling channels is of different size than a corresponding cross section of the cooling channels of the second set of two-phase cooling channels.

8. The cooling plate of claim 6, wherein a footprint of the cooling channels of the first set of cooling channels is of different size than a corresponding footprint of the cooling channels of the second set of two-phase cooling channels.

9. The cooling plate of claim 1, wherein the thermally conductive plate assembly comprises a contact plate; an upper plate; a core section sandwiched between the contact plate and the upper plate, wherein the first set of cooling channels and the second set of two-phase cooling channels are formed within the core section; and a main cooling fluid supply manifold formed in one of the contact plate or the upper plate.

10. The cooling plate of claim 9, wherein the core section comprises alternate ridges and grooves forming corrugations.

11. The cooling plate of claim 10, wherein the corrugations are skewed, such that cooling channels of the first set of cooling channels are of different size than the cooling channels of the second set of two-phase cooling channels.

12. The cooling plate of claim 10, further comprising a secondary cooling fluid supply manifold formed in one of the contact plate or the upper plate; and wherein the main cooling fluid supply manifold is fluidly coupled to the first set of cooling channels and the secondary cooling fluid supply manifold is fluidly coupled to the second set of two-phase cooling channels.

13. The cooling plate of claim 1, wherein the first set of cooling channels are structured for a thermal cycle selected from pumped single phase cooling, pumped two phase cooling, pumpless single loop thermosiphon cooling, and the second set of two-phase cooling channels are structured for a thermal cycle selected from pumped single phase cooling, pumped two phase cooling, pumpless single loop thermosiphon cooling different from the thermal cycle of the first set of cooling channels.

14. The cooling plate of claim 1, wherein the second set of two-phase cooling channels include a secondary fluid different from the cooling fluid delivered to the first set of cooling channels.

15. A cooling system for cooling a microchip, comprising:
a cold plate assembly incorporating a first set of cooling channels and a second set of two-phase cooling channels, wherein the second set of two-phase cooling channels is fluidly isolated from the first set of cooling channels such that the cooling fluid from the first set of cooling channels is prevented from flowing into the second set of two-phase cooling channels, wherein the first set of cooling channels and the second set of two-phase cooling channels form two different cooling channel circulations, wherein the first set of cooling channels circulation is operated as a main cooling and run continuously, and the second set of two-phase cooling channels circulation is operated as a backup, wherein the second set of two-phase cooling channels circulation is operated when the main cooling fails, wherein each of the second set of two-phase cooling channels comprises an evaporation chamber and evaporation condensation pipes attached to cooling lamellas, wherein the evaporation condensation pipes are inside the second set of two-phase cooling channels, wherein the cooling lamellas are inside the second set of two-phase cooling channels, wherein the cooling fluid in the evaporation chamber heats up, the cooling fluid vaporizes and rises in the evaporation condensation pipes, and the evaporation condensation pipes are cooled by the cooling lamellas, and wherein each of the second set of two-phase cooling channels comprises a wicking block to sustain the cooling fluid;
a main condenser;
a main supply line fluidly coupled between the main condenser and the first set of cooling channels;
a main return line fluidly coupled between the main condenser and the first set of cooling channels.

16. The cooling system of claim 15, further comprising:
a secondary condenser;
a secondary supply line fluidly coupled between the secondary condenser and the first set of cooling channels;
a pump coupled to the secondary supply line; and,
a secondary return line fluidly coupled between the secondary condenser and the first set of cooling channels.

17. The cooling system of claim 15, the second set of two-phase cooling channels comprises a plurality of isolated self-contained sealed chambers, each forming a two-phase evaporation and condensation chamber.

18. The cooling system of claim 15, wherein the cold plate assembly comprises a contact plate; an upper plate; a core section sandwiched between the contact plate and the upper plate; wherein the first set of cooling channels and the second set of two-phase cooling channels are formed within the core section.

19. The cooling system of claim 18, further comprising at least one intake manifold formed in one of the contact plate or the upper plate and at least one return manifold formed in one of the contact plate or the upper plate.

20. The cooling system of claim 15, wherein the cold plate assembly further comprises at least one heat spreader in physical contact with the first set of cooling channels and the second set of two-phase cooling channels.

* * * * *